US012655319B2

(12) United States Patent
Ren et al.

(10) Patent No.: US 12,655,319 B2
(45) Date of Patent: Jun. 16, 2026

(54) CHEMICAL MECHANICAL POLISHING SOLUTION

(71) Applicant: ANJI MICROELECTRONICS TECHNOLOGY (SHANGHAI) CO., LTD, Shanghai (CN)

(72) Inventors: Xiaoming Ren, Shanghai (CN); Changzheng Jia, Shanghai (CN); Shoutian Li, Shanghai (CN)

(73) Assignee: Anji Microelectronics Technology (Shanghai) Co., Ltd., Shanghai (CN)

( * ) Notice: Subject to any disclaimer, the term of this patent is extended or adjusted under 35 U.S.C. 154(b) by 140 days.

(21) Appl. No.: 17/783,559

(22) PCT Filed: Dec. 3, 2020

(86) PCT No.: PCT/CN2020/133611
§ 371 (c)(1),
(2) Date: Jun. 8, 2022

(87) PCT Pub. No.: WO2021/121048
PCT Pub. Date: Jun. 24, 2021

(65) Prior Publication Data
US 2023/0027829 A1    Jan. 26, 2023

(30) Foreign Application Priority Data
Dec. 19, 2019    (CN) ......................... 201911319077.4

(51) Int. Cl.
C09G 1/02        (2006.01)
B24B 1/00        (2006.01)
(Continued)

(52) U.S. Cl.
CPC .................. C09G 1/02 (2013.01); B24B 1/00 (2013.01); B24B 37/044 (2013.01); C09G 1/00 (2013.01);
(Continued)

(58) Field of Classification Search
None
See application file for complete search history.

(56) References Cited

U.S. PATENT DOCUMENTS

2005/0164510 A1*  7/2005  Ikeda ................ H01L 21/31053
                                                    438/692
2008/0274618 A1   11/2008  Kraft
(Continued)

FOREIGN PATENT DOCUMENTS

CN        1648191 A      8/2005
CN    101065458 A     10/2007
(Continued)

OTHER PUBLICATIONS

"Polyacrylic Acid" in Wikipedia, the Free Encyclopedia, Wikipedia Foundation, printed on Mar. 26, 2025. (Year: 2025).*
(Continued)

*Primary Examiner* — Jiong-Ping Lu
(74) *Attorney, Agent, or Firm* — Dentons US LLP

(57) ABSTRACT

Disclosed is a chemical mechanical polishing solution containing cerium oxide, polyacrylic acid, polyvinyl amine and water. In this invention polyvinyl amine can serve as an additive to reduce the dishing amount of patterned wafer by negatively charged cerium oxide, and improve the efficiency of planarization.

5 Claims, 2 Drawing Sheets

(51) Int. Cl.

| | |
|---|---|
| *B24B 37/04* | (2012.01) |
| *C09G 1/00* | (2006.01) |
| *C09G 1/04* | (2006.01) |
| *C09G 1/06* | (2006.01) |
| *C09K 3/14* | (2006.01) |
| *C09K 13/06* | (2006.01) |
| *H10P 52/40* | (2026.01) |
| *H10P 95/00* | (2026.01) |

(52) U.S. Cl.

CPC ................ *C09G 1/04* (2013.01); *C09G 1/06* (2013.01); *C09K 3/1454* (2013.01); *C09K 3/1463* (2013.01); *C09K 13/06* (2013.01); *H10P 52/40* (2026.01); *H10P 52/402* (2026.01); *H10P 52/407* (2026.01); *H10P 95/02* (2026.01); *H10P 95/06* (2026.01); *H10P 95/062* (2026.01)

(56) References Cited

U.S. PATENT DOCUMENTS

| | | | | |
|---|---|---|---|---|
| 2016/0237316 A1* | 8/2016 | Suzuki | ............. | H01L 21/31053 |
| 2018/0258319 A1* | 9/2018 | Akutsu | ................... | C09G 1/00 |

FOREIGN PATENT DOCUMENTS

| | | | | |
|---|---|---|---|---|
| JP | 2017178986 | * | 10/2017 | ............. B24B 37/00 |
| WO | WO2011093195 | * | 8/2011 | .......... C09K 3/1409 |

OTHER PUBLICATIONS

First Office Action for CN Appl. No. 201911319077.4 issued May 20, 2023, 5 pages.

Second Office Action for CN Appl. No. 201911319077.4 issued Dec. 6, 2023, 6 pages.

* cited by examiner

CHEMICAL MECHANICAL POLISHING SOLUTION

CROSS-REFERENCE TO PRIOR APPLICATIONS

This application is a National Stage of PCT/CN2020/133611, filed Dec. 3, 2020 and published Jun. 24, 2021 as WO 2021/121048 A1, which claims priority to Chinese Patent Application No. 201911319077.4, filed Dec. 19, 2019, each hereby expressly incorporated by reference in its entirety.

TECHNICAL FIELD

The present invention relates to a chemical mechanical polishing solution, in particular to one chemical mechanical polishing solution.

BACKGROUND

Currently, chemical mechanical polishing (CMP) has become the most effective and mature planarization technology in the process of manufacturing micro-nano devices. In the process of manufacturing micro-nano devices, the process of Shallow Trench Isolation (STI) has become the mainstream isolation technology in recent years because of its outstanding performance of isolation, flat morphology and good locking performance.

In the polishing process of shallow trench isolation, the polishing rate of silicon oxide and silicon nitride by polishing solution generally has a high selection ratio. An exposed silicon nitride layer ideally can stop polishing as a barrier layer. And an over-polished silicon nitride layer will be recessed to form a so-called "Dishing", resulting in the reduction of planarization efficiency. Therefore, there is a need to find a chemical mechanical polishing solution to improve the planarization efficiency.

DESCRIPTION

To solve the problem that negatively charged cerium oxide treated by acrylic acid is susceptible to dishing formation as a result of over-polishing, which exists in the prior art, the invention provides a chemical mechanical polishing solution, which includes cerium oxide, polyacrylic acid, polyvinyl amine and water. The chemical mechanical polishing solution in this application cannot only keep a high polishing rate of silicon dioxide, but also reduce the dishing mount of patterned wafer by negatively charged cerium oxide.

Further, the concentration of the polyvinyl amine is 1-80 ppm.

Further, the molecular weight of the polyvinyl amine is 1,300-750,000.

Further, the concentration of the cerium oxide is 0.1 wt %-1.5 wt %, preferably 0.4 wt %.

Further, the concentration of the polyacrylic acid is 500-1,500 ppm, preferably 900 ppm.

Further, the chemical mechanical polishing solution also includes a pH regulator.

Further, the pH regulator is ammonia water, potassium hydroxide or nitric acid, acetic acid, hydrochloric acid and sulfuric acid.

Further, the pH of the chemical mechanical polishing solution is 4-8. If it is less than 4, the particle size becomes larger; if it is greater than 8, the effect of the chemical mechanical polishing with shallow trench isolation process is unsatisfactory.

In the present invention, ppm refers to the mass concentration expressed with the parts per million of solute mass to total solution mass, which is called ppm concentration. The wt % and the percentage of each component are mass percentage concentrations.

The reagents and raw materials used in the invention are commercially available.

Compared with the prior art, this invention has the advantages that the chemical mechanical polishing solution with polyvinyl amine as an additive cannot only keep a high polishing rate of silicon dioxide, but also reduce the dishing amount on patterned wafer by negatively charged cerium oxide, thus improving the planarization efficiency. Preferably, with a molecular weight ranging from 1,300 to 750,000 and a content of 65 ppm or below, the polyvinyl amine performs best in reducing the dishing amount.

DRAWING REFERENCE MARKS

1—bump, 2—pit, H1—bump line width, H2—pit width.

Embodiments

The advantages of an embodiment of the invention will be explained in detail with reference to the following drawing and embodiments.

In this invention, the chemical mechanical polishing solution prepared by mixing polyvinyl amine and acrylic acid-treated cerium oxide can effectively control the dishing after polishing the dielectric layer substrate, and the method is simple, convenient and low in cost.

Embodiment

Preparation method: In this embodiment, reference embodiment is 0.4 wt % cerium oxide and the acrylic acid content is 530 ppm. In other embodiments and comparative embodiments, polyvinyl amine with different molecular weights and contents is added to the reference embodiment, with pH value being adjusted to 4.5 by adding ammonia water (NH4OH) or nitric acid (HNO3), and mass percentage being complemented to 100% with water. Refer to Table 1 for details of components.

Figure 1:
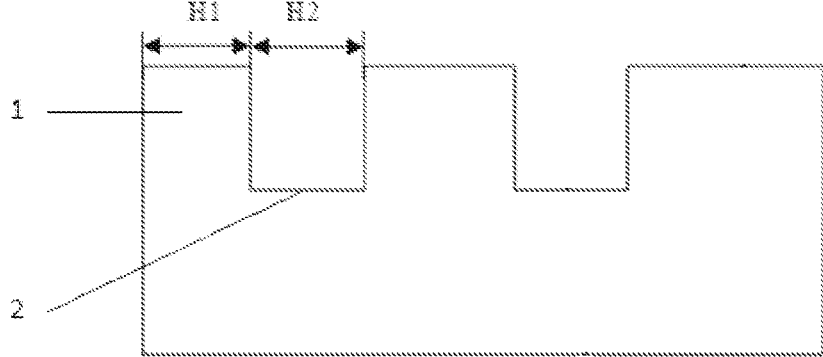
FIG. 1 is the structure diagram of longitudinal section of patterned wafers

Polishing method: The polishing machine Mirra is used to polish TEOS blanks and patterned wafers. The polishing rate of silicon dioxide by the polishing solution in this application is tested on the TEOS blanks, and the inhibition of dishing increase by the polishing solution in this application is tested on the patterned wafers. The corresponding polishing conditions include: IC1010 polishing pad, polishing disk (Platten) and polishing head (Carrier) with rotating speed being set at 93 rpm and 87 rpm, respectively, pressure set at 4 psi, and flow rate of polishing solution set at 150 mL/min. The thickness of TEOS films is measured by using Nano-Spec nonmetal film thickness measuring instrument (Nano-Spec6100-300). The thickness of the blanks is obtained by measuring 49 points on the diameter line with equal intervals, starting from 3 mm away from the edge of the wafer. The polishing rate is the average value of these 49 points. The step height of the patterned wafer is measured by using a probe profiler (Bruker Nano's DETKAK XTL). FIG. 1 is the structure diagram of longitudinal section of patterned wafers in the prior art, where the patterned wafer has bump 1 and pit 2, salient point bump line width H1 and pit width H2. The measurement is performed at the bump line width H1/Pit width H2 of 500 um/500 um, 100 um/100 um, and 50 um/50 um, respectively.

TABLE 1

Relationship between Polyvinyl Amine (PEI-1.3 k) with Molecular Weight of 1,300 and Polishing Rate (RR) of Silicon Dioxide (TEOS) Blanks

| Polishing solution | PEI-1.3 k (ppm) | TEOS RR (Å/min) | | | |
|---|---|---|---|---|---|
| | | 1.5 psi | 2 psi | 3 psi | 4 psi |
| 1A (comparative embodiments) | 0 | 611 | 1,047 | 1,770 | 2,168 |
| 1B (embodiment) | 2 | 605 | 1,007 | 1,718 | 2,308 |
| 1C (embodiment) | 10 | 639 | 1,046 | 1,809 | 2,376 |
| 1D (embodiment) | 50 | 624 | 985 | 1,687 | 2,241 |
| 1E (embodiment) | 65 | 548 | 844 | 1,533 | 2,217 |
| 1F (embodiment) | 80 | 493 | 784 | 1,167 | 1,552 |
| 1G (embodiment) | 100 | 314 | 425 | 623 | 814 |

Figure 2:
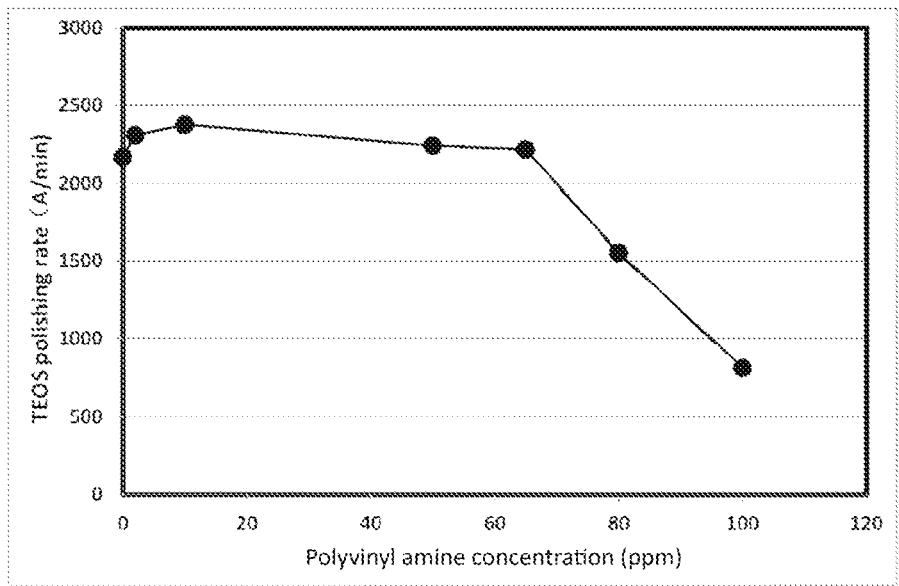
FIG. 2 shows the relationship between the polishing rate of silicon dioxide and the concentration of polyvinyl amine (molecular weight 1,300) when the pressure is set at 4 psi.

Table 1 shows that when the content of PEI-1.3k is 65 ppm or below, the polishing rate of silicon dioxide will hardly be affected as the content of PEI-1.3k increases. For example, when the polishing pressure is set at 1.5 psi, the polishing rates of silicon dioxide are 611, 605, 639, 624 and 548, corresponding to the content of PEI-1.3k of 0, 2, 10, 50 and 65, respectively; when the polishing pressure is set at 2 psi, the polishing rates of silicon dioxide are 1,047, 1,007, 1,046, 985 and 844, corresponding to the content of PEI-1.3k of 0, 2, 10, 50 and 65, respectively; when the polishing pressure is set at 3 psi, the polishing rates of silicon dioxide are 1,770, 1,718, 1,809, 1,687 and 1,533, corresponding to the content of PEI-1.3k of 0, 2, 10, 50 and 65, respectively; and when the polishing pressure is set at 4 psi, the polishing rates of silicon dioxide are 2,168, 2,308, 2,376, 2,241 and 2,217, corresponding to the concentration of PEI-1.3k of 0, 2, 10, 50 and 65, respectively. However, when the content of the PEI-1.3k reaches 80 ppm and 100 ppm, respectively, there exists significant difference between the polishing rates of silicon dioxide corresponding to different polishing pressures and the foregoing polishing rates. More specifically, the polishing rate of silicon dioxide is significantly reduced. The experiment data obtained when the polishing pressure is set at 4 psi in Table 1 are converted into FIG. 2, where it can be seen intuitively that the polishing rates of silicon dioxide keep stable at the range from 2,168 to 2,376 Å as the content of PEI-1.3k increases from 0 to 65 ppm, but once the content of PEI-1.3k reaches 80 ppm or higher, the polishing rate of silicon dioxide begins to fall. In other words, the range of 65-80 ppm is the critical point for the content of PEI-1.3k to exert influence on the polishing rate of silicon dioxide.

TABLE 2

Relationship between Polishing Rate of Silicon Dioxide and Molecular Weight and Concentration of Polyvinyl Amine

| Polishing solution | Molecular weight of polyvinyl amine | PEI concentration (ppm) | TEOS RR Å/min @ 1.5 psi | TEOS RR Å/min @ 2 psi | TEOS RR Å/min @ 3 psi | TEOS RR Å/min @ 4 psi |
|---|---|---|---|---|---|---|
| 2A (comparative embodiments) | n/a | 0 | 701 | 1,109 | 1,829 | 2,395 |
| 2B (embodiment) | 1,300 | 50 | 624 | 985 | 1,687 | 2,241 |
| 2C (embodiment) | 1,300 | 65 | 548 | 844 | 1,533 | 2,217 |
| 2D (embodiment) | 2,500 | 45 | 765 | 1,037 | 1,778 | 2,233 |
| 2E (embodiment) | 2,500 | 65 | 550 | 669 | 868 | 1,096 |
| 2F (embodiment) | 70,000 | 45 | 726 | 1,106 | 1,696 | 2,163 |
| 2G (embodiment) | 750,000 | 40 | 791 | 1,192 | 1,822 | 2,299 |
| 2H (embodiment) | 750,000 | 65 | 667 | 785 | 1,014 | 1,273 |

Table 2 shows that as the molecular weight of the polyvinyl amine increases, the critical point of polyvinyl amine concentration decreases to exert influence on the polishing rate of silicon dioxide. For example, compared with comparative embodiment 2A, when the same polishing rate is reached, the required concentration of polyvinyl amine decreases as the molecular weight of polyvinyl amine increases. Specifically, in Table 2, for example, when the molecular weight is 1,300 and the concentration is 65 ppm, the polishing rate does not decrease by more than 300 Å/min compared with that of the comparative embodiment 2A. When the molecular weight is 2,500, and the concentration is 65 ppm, the polishing rate decreases by more than 1,000 Å/min. However, when the molecular weight is 2,500, and the concentration is 45 ppm, the polishing rate does not decrease compared with that of the comparative embodiment 2A.

TABLE 3

| | | Dishing increase @ (Å) 500/500 um | Dishing increase @ (Å) 100/100 um | Dishing increase @ (Å) 50/50 um |
|---|---|---|---|---|
| Polishing solution | Additive | | | |
| 3A (comparative embodiments) | Not available | 243 | 165 | 145 |
| 3B (embodiment) | 65 ppm PEI (Mw = 1,300) | 108 | 46 | 59 |

Effect of Polyvinyl Amine (Molecular Weight 1,300) as an Additive on Dishing Formation Table 3 shows that polyvinyl amine with a molecular weight of 1,300 (concentration of 65 ppm) can perform effective reduction of dishing formation at different measuring points (500/500 um, 100/100 um and 50/50 um), compared with polishing solutions with absence of polyvinyl amine.

TABLE 4

| | | Dishing increase @ (Å) 500/500 um | Dishing increase @ (Å) 100/100 um | Dishing increase @ (Å) 50/50 um |
|---|---|---|---|---|
| Polishing solution | Additive | | | |
| 4A (comparative embodiments) | None | 209 | 166 | 162 |
| 4B (embodiment) | 50 ppm PEI (Mw = 1,300) | 152 | 125 | 112 |
| 4C (embodiment) | 65 ppm PEI (Mw = 1,300) | 61 | 57 | 61 |
| 4D (embodiment) | 40 ppm PEI (Mw = 2,500) | 113 | 79 | 54 |
| 4E (embodiment) | 45 ppm PEI | 209 | 149 | 136 |

Effect of Polyvinyl Amine with Different Molecular Weight as an Additive on Dishing Formation Table 4 shows that, as the content of the polyvinyl amine with a molecular weight of 1,300 increases from 50 ppm to 65 ppm, embodiment 4C performs with higher effectiveness in reducing the dishing than embodiment 4B does. However, when the concentration of PEI is kept constant, the less is the molecular weight of polyvinyl amine, the more effective is the reduction of dishing. For example, when the concentration of PEI is 40 ppm, the molecular weight of PEI in embodiment 4D is 2,500, while that of PEI in embodiment 4F is 750,000, showing that the embodiment 4D performs more effectively that the embodiment 4F in reducing the dishing.

In conclusion, the chemical mechanical polishing solution containing polyvinyl amine and acrylic acid-treated cerium oxide can effectively reduce the dishing in the polishing process of shallow trench isolation. With a molecular weight ranging from 1,300 to 750,000 and a content of 65 ppm or below, the polyvinyl amine performs best in reducing the dishing amount. Meanwhile, all components of the chemical mechanical polishing solution in this application only need to be simply mixed, which is simple in operation and low in cost. Although the above specific embodiments of the present invention have been described in detail, they are only examples, and the present disclosure is not for limited to the embodiment described above. For those skilled in the art, any equivalent modification and substitution to the present invention is also covered in the present invention. Therefore, all of these equivalent changes and modifications made without departing from the spirit and scope of the invention should be covered within the scope of the present invention.

In conclusion, the chemical mechanical polishing solution containing polyether amine and acrylic acid-treated cerium oxide can effectively reduce the dishing in the polishing process of shallow trench isolation. With a molecular weight ranging from 1,300 to 750,000 and a content of 65 ppm or below, the polyether amine performs best in reducing the dishing amount. Meanwhile, all components of the chemical mechanical polishing solution in this application only need to be simply mixed, which is simple in operation and low in cost. Although the above specific embodiments of the present invention have been described in detail, they are only examples, and the present disclosure is not for limited to the embodiment described above. For those skilled in the art, any equivalent modification and substitution to the present invention is also covered in the present invention. Therefore, all these equivalent changes and modifications made without departing from the spirit and scope of the invention should be covered within the scope of the present invention.

The invention claimed is:

1. A chemical mechanical polishing solution, consisting of cerium oxide, monomeric acrylic acid, a polyvinyl amine, water, and a pH regulator, wherein:
   a molecular weight of said polyvinyl amine is 1,300 or 2,500;
   when the molecular weight of said polyvinyl amine is 1,300, a concentration of said polyvinyl amine is 50-65 ppm;
   when the molecular weight of said polyvinyl amine is 2,500, the concentration of said polyvinyl amine is 40-50 ppm;
   a concentration of said monomeric acrylic acid is 500-1,500 ppm; and
   a pH of the chemical mechanical polishing solution ranges from 4 to 8.

2. The chemical mechanical polishing solution according to claim 1, wherein a concentration of said cerium oxide is 0.1 wt %-1.5 wt %.

3. The chemical mechanical polishing solution according to claim 2, wherein the concentration of said cerium oxide is 0.4 wt %.

4. The chemical mechanical polishing solution according to claim 1, wherein said pH regulator is selected from the group consisting of ammonia water, potassium hydroxide or nitric acid, acetic acid, hydrochloric acid and sulfuric acid.

5. The chemical mechanical polishing solution according to claim 1, wherein the concentration of said acrylic acid is 900 ppm.

* * * * *